United States Patent [19]
Sakata

[11] Patent Number: 5,604,451
[45] Date of Patent: Feb. 18, 1997

[54] SENSE AMPLIFIER CIRCUIT

[75] Inventor: Toshikazu Sakata, Miyazaki, Japan

[73] Assignee: Oki Electric Industry Co., Ltd., Tokyo, Japan

[21] Appl. No.: 515,050

[22] Filed: Aug. 14, 1995

[30] Foreign Application Priority Data

Aug. 30, 1994 [JP] Japan ................................. 6-204075

[51] Int. Cl.[6] ................................. H03F 3/45; G11C 7/00
[52] U.S. Cl. ............................ 327/51; 327/63; 327/437; 365/189.09
[58] Field of Search ..................... 327/51, 56, 62, 327/52, 63, 65, 72, 99, 408, 403, 404, 437, 378, 333; 365/189.09, 205, 189.07, 207, 208

[56] References Cited

U.S. PATENT DOCUMENTS

| | | | |
|---|---|---|---|
| 3,502,905 | 3/1970 | Bicking | 327/65 |
| 5,280,198 | 1/1994 | Almulla | 327/63 |
| 5,280,199 | 1/1994 | Itakura | 327/63 |
| 5,391,938 | 2/1995 | Hatsuda | 327/63 |
| 5,402,375 | 3/1995 | Horiguchi et al. | 327/408 |

OTHER PUBLICATIONS

Katsuro Sasaki et al, "A 7ns 140mW 1Mb CMOS SRAM with Current Sense Amplifier," 1992 IEEE International Solid-State Circuits Conference, pp. 208-209.

Primary Examiner—Timothy P. Callahan
Assistant Examiner—My-Trang Nu Ton
Attorney, Agent, or Firm—Law Office of Steven M. Rabin

[57] ABSTRACT

A highly stable sense amplifier circuit for a RAM and ROM includes a bias generating circuit capable of changing a bias voltage corresponding to voltage shifts of data lines, and an amplifying circuit having a transistor, the conducting state of which is controlled by the bias voltage for amplifying the voltage differences of the data lines. When the voltage of the data lines shifts due to manufacturing deviations, the bias voltage also shifts but operates so as to compensate shifts of the transistor in the amplifying circuit, so that the sense amplifier circuit can amplify the voltage differences of the data lines in a stable manner. The sense amplifier circuit can be formed with switches for cutting off through-currents, so that the sense amplifier circuit or even the memory on which the sense amplifier circuit is formed can operate with low power consumption.

13 Claims, 4 Drawing Sheets

SENSE AMPLIFIER CIRCUIT

CROSS-REFERENCE TO RELATED APPLICATIONS

This application claims priority benefits under 35 USC §119 of Japanese Application Serial No. Hei 6-204075, filed Aug. 30, 1994, the entire disclosure of which is incorporated herein by reference.

BACKGROUND OF THE INVENTION

1. Field of the Invention

This invention relates to a sense amplifier circuit for stably amplifying very small voltage differences, for example, in a semiconductor memory such as a RAM (Random Access Memory) or a ROM (Read Only Memory) and, more particularly, to a current sensing type sense amplifier circuit for a memory.

2. Description of Related Art

Sense amplifier circuits are generally used to amplify very small voltage differences in a memory device. This type of the sense amplifier circuit has been disclosed in various literature (such as a publication entitled "A 7 ns 140 mW 1 Mb CMOS SRAM with Current Sense Amplifier" 1992 IEEE International Solid-State Circuits Conference; pp. 208 and 209 authored by Katsuro Sasaki et al.)

Such a conventional sense amplifier, however, has the following problems. Lack of uniformity in manufacturing processes or positional shifts of masks may cause a transistor's parameters to deviate among many memory cells in a produced memory. The voltage or current given to the data lines therefore varies, so that the sense amplifiers suffer from output deviations. In general, a great number of sense amplifier circuits are placed on a memory chip. When each sense amplifier circuit uses many elements such as transistors, all the sense amplifier circuits tend to occupy a relatively large total mount of area on the memory chip and make it difficult to obtain a higher density memory. Moreover, today's memory standards require low power consumption.

SUMMARY OF THE INVENTION

It is therefore an object of the present invention to provide a sense amplifier circuit for amplifying very small voltage differences even when transistor's parameters are deviated due to lack of uniformity in manufacturing processes.

It is another object of the present invention to provide a sense amplifier occupying a smaller area and consuming low power without sacrificing high sensitivity.

The foregoing objects are accomplished with a sense amplifier circuit including a bias generating circuit coupled between a data line and a first potential for setting a bias voltage corresponding to shifts of a current flowed from the data line, and an amplifying circuit coupled between the data line and a second potential, having a transistor whose conducting state is controlled based on the bias voltage and a load connected in series with the transistor, for providing a voltage corresponding to the voltage of the data line. The transistor in the amplifying circuit operates based on the bias voltage reflecting the current flowed from the data line. Even if the current of the data line is deviated due to manufacturing deviations, both of the bias generating circuit and the amplifying circuit are commonly influenced with the current, so that the sense amplifier is able to provide stable outputs. The bias generating circuit and the amplifying circuit of the sense amplifier circuit may be formed with transistors for cutting off the connections with the first and second potentials, respectively. When the sense amplifier circuit does not have to operate, the transistors are made cut off to save power consumption.

BRIEF DESCRIPTION OF THE DRAWINGS

The above and other objects and features of the invention will be apparent to those skilled in the art from the following preferred embodiments thereof when considered in conjunction with the accompanying drawings, in which.

DETAILED DESCRIPTION OF THE PREFERRED EMBODIMENTS

First Embodiment

Figure 1:
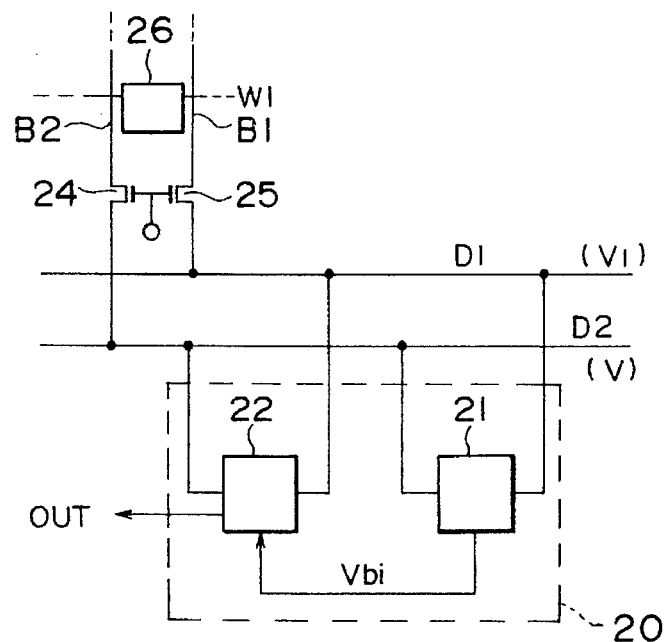
FIG. 1 is a block diagram showing a sense amplifier circuit according to a first preferred embodiment of the present invention.
Figure 2:
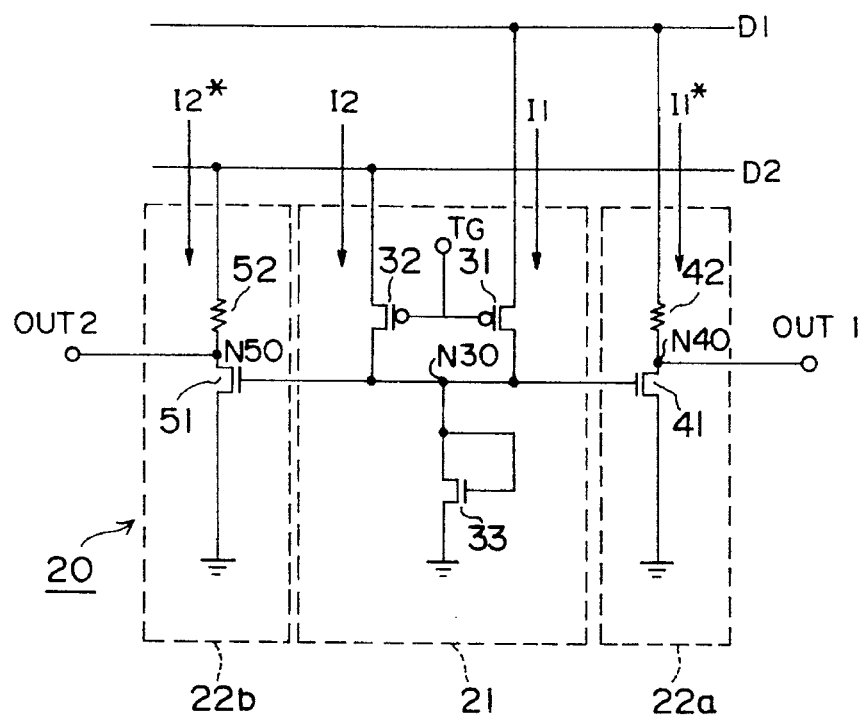
FIG. 2 is a circuit diagram showing the sense amplifier circuit shown in FIG. 1.

Referring to the drawings in detail, in particular, to FIG. 1 and 2, a sense amplifier circuit according to a preferred embodiment of the invention is shown.

FIG. 1 shows the basic structure of the sense amplifier circuit 20. The sense amplifier circuit 20 includes a bias generating circuit 21 and an amplifying circuit 22. The bias generating circuit 21 and the amplifying circuit 22 are coupled to data lines D1, D2 to which voltages are applied through NMOS transistors 25, 24 operating as column switches. The output of the bias generating circuit 21 is coupled to the amplifying circuit 22. The bias generating circuit 21 generates a bias voltage Vbi based on current flowing from the data lines D1, D2. The amplifying circuit 22 amplifies the voltage difference between the data lines D1, D2 using the bias voltage Vbi and provides the amplified voltage difference to the output thereof. The sense amplifier circuit 20 is formed as a part of an SRAM. The detailed circuit of the SRAM is omitted for the sake of simplicity. The data lines D1, D2 are coupled to bit line pairs, although only one bit line pair B1, B2 is illustrated. The bit line pairs are precharged to a power supply voltage Vdd through a certain load. The bit lines of each pair, when selected, become logical complements of one another, as do the data lines D1, D2. Memory cells, although only one memory cell 26 is illustrated, provided in the form of an array or matrix are coupled to the bit lines B1, B2 when the corresponding word line W is energized. The row address decoded by an X decoder determines one word line W to be energized; the column address decoded by a Y decoder determines one column switch pair, such as NMOS transistors 24, 25, to be selected.

FIG. 2 shows a more detailed circuit of the sense amplifier circuit 20. The amplifying circuit 22 is composed of two amplifiers 22a, 22b. The amplifier 22a is connected to the data line D1; the amplifier 22b is connected to the data line D2. The bias generating circuit 21 provides the bias voltage to both of the two amplifiers 22a, 22b.

The bias generating circuit 21 includes two PMOS transistors 31, 32 serving as active loads. The sources of the PMOS transistors 31, 32 are coupled to the data lines D1, D2, respectively. The PMOS transistors 31, 32 are connected to each other by their drains at a node N30. The gates of the PMOS transistors 31, 32 are commonly supplied with a control signal TG. When the control signal TG is at a low level, the PMOS transistors 31, 32 are put in an ON state. When the control signal TG is at a high level, the PMOS transistors 31, 32 are put in an OFF state. The node N30 is connected to the gate and drain of an NMOS transistor 33, the source of which is connected to a ground potential level Vss as a first potential. The amplifier 22a includes an NMOS transistor 41 whose gate receives the voltage of the node N30 of the bias generating circuit 21. The drain of the NMOS transistor 41 is coupled to the data line D1 through a load resistor 42. The source of the NMOS transistor 41 is connected to the ground potential level Vss as a second potential. A connection node N40 between the NMOS transistor 41 and the resistor 42 is connected to an output terminal OUT1. The amplifier 22b includes an NMOS transistor 51, the gate of which receives the voltage of the node N30 of the bias generating circuit 21. The drain of the NMOS transistor 51 is coupled to the data line D2 through a load resistor 52. The source of the NMOS transistor 51 is connected to the ground potential level Vss as a second potential. A connection node N50 between the NMOS transistor 51 and the resistor 52 is connected to an output terminal OUT2.

In operation, when the small voltage differences at the memory cells measured on the data lines D1, D2 (shift voltages with respect to the original reference voltage) are read, the control signal TG is pulled down to a low level, thereby switching the PMOS transistors 31, 32 to the ON state. When the PMOS transistors 31, 32 are the ON state, a current I1 flows from the data line D1 to the PMOS transistor 31, and a current I2 flows from the data line D2 to the PMOS transistor 32. The total current (I1+I2) in summation of the current I1 and the current I2 flows through the NMOS transistor 33. The magnitude of the total current (I1+I2) is determined by the voltages of the data lines D1, D2 and the resistances of the PMOS and NMOS transistors 31, 32, and 33. The node N30 is set at a voltage based on the total current (I1+I2) and is given as the bias voltage to the gates of the NMOS transistors 41, 51 of the amplifiers 22a, 22b. Accordingly, the bias voltage controls the conducting states of the NMOS transistors 41, 51. In the amplifiers 22a, 22b, a current I1* flows from the data line D1, and a current I2* flows from the data line D2. The magnitude of the current I1* is determined by the voltage of the data line D1, the resistance of the resistor 42, and conducting state of the NMOS transistor 41; the magnitude of the current I2* is determined by the voltage of the data line D2, the resistance of the resistor 52, and conducting state of the NMOS transistor 51. The nodes N40, N50 are respectively set at the voltages that the voltage differences between the ground potential level Vss and the data lines D1, D2 are respectively divided in proportion to the resistances of the load resistances 42, 52 and the resistances of the NMOS transistors 41, 51. Consequently, the two output terminals OUT1, OUT2 provide amplified voltages corresponding to the small voltage difference between the data lines D1, D2.

Figure 3:
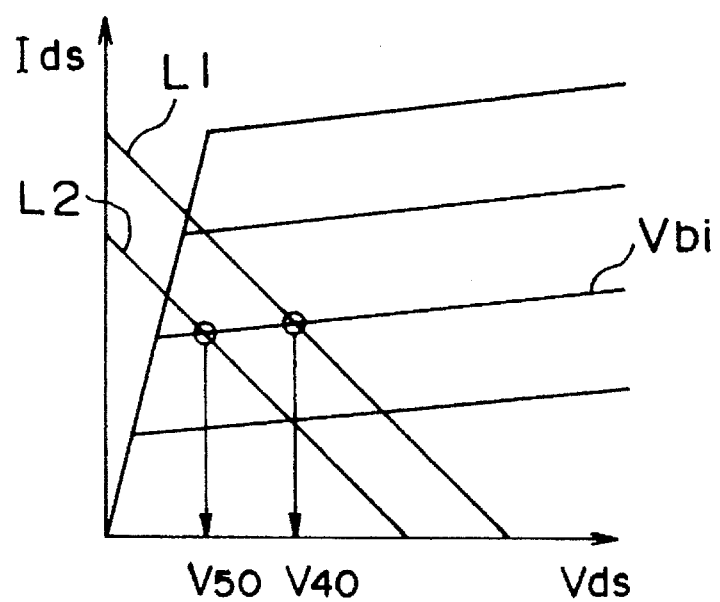
FIG. 3 and 4 are diagrams showing output characteristics of the sense amplifier circuit shown in FIG. 3, when ideal and when manufacturing deviations occur, respectively.

Referring to FIG. 3, the voltages at the nodes N40, N50 are described as follows. In FIG. 3, the relation between the drain-source voltage Vds and the drain current Ids of the NMOS transistors 41, 51 when the bias voltage is constant, a load line L1 for the current I1*, and a load line L2 for the current I2*, are shown. The voltages of the nodes N40, N50, or output voltages of the output terminals OUT1, OUT2, are indicated by crossing points of the load lines L1, L2 and line corresponding to the bias voltage Vbi applied to the gates of the NMOS transistors 41, 51. That is, the voltage $V_{40}$ of the node N40 corresponds to the point where the load line L1 crosses the line of the voltage Vbi; the voltage $V_{50}$ where the node NSO corresponds to the point of the load line L2 crosses the line of the voltage Vbi.

Figure 4:
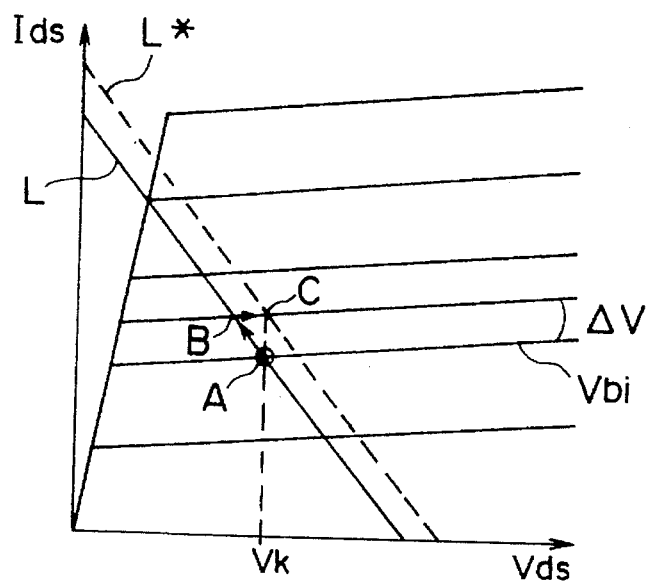

FIG. 4 shows outputs of the sense amplifier circuit 20. In particular, the output state of the sense amplifier circuit 20 when the current deviates due to manufacturing deviations is described. Due to deviations in the manufacturing processes, the current I1 shifts to a current I1+Δ1 (reference current plus shift current); the current I2 shifts to a current I2+Δ2; the current I1* shifts to a current I1*+Δ1*; and the current I2* shifts to a current I2*×Δ2*. A total current (I1×Δ1)+(I2×Δ2) flows through the NMOS transistor 33, thereby increasing the bias voltage Vbi by ΔV. Consequently, for example, the output voltage $V_{50}$ from the output terminal OUT2 may shift from point A to point B in FIG. 5. Likewise, the current I1* also shifts to the current I1*+Δ1*, and therefore, the load line L1 also shifts to the load line L*. As a result, the actual output voltage $V_{50}$ is indicated by point C. The point C indicates Vk, which is the same as the voltage indicated by the point A, in the axis of the drain-source voltage Vds. In other words, the sense amplifier circuit 20 is effectively preventing the output voltage $V_{50}$ from shifting. Similarly, the deviations of output voltage $V_{40}$ is also suppressed.

As described above, the sense amplifier circuit 20 is constituted so that the bias generating circuit 21 generates from the current I1, I2 the bias voltage which controls conducting states of the NMOS transistors 41, 51 in the amplifiers 22a, 22b. The sense amplifier circuit 20 can therefore suppress deviations of the output voltages $V_{40}$, $V_{50}$, and particularly, when used as a sense amplifier for an SRAM (static RAM), the sense amplifier circuit 20 can stably amplify very small voltage differences between the data lines D1, D2 in a stable manner.

Second Embodiment

Figure 5:
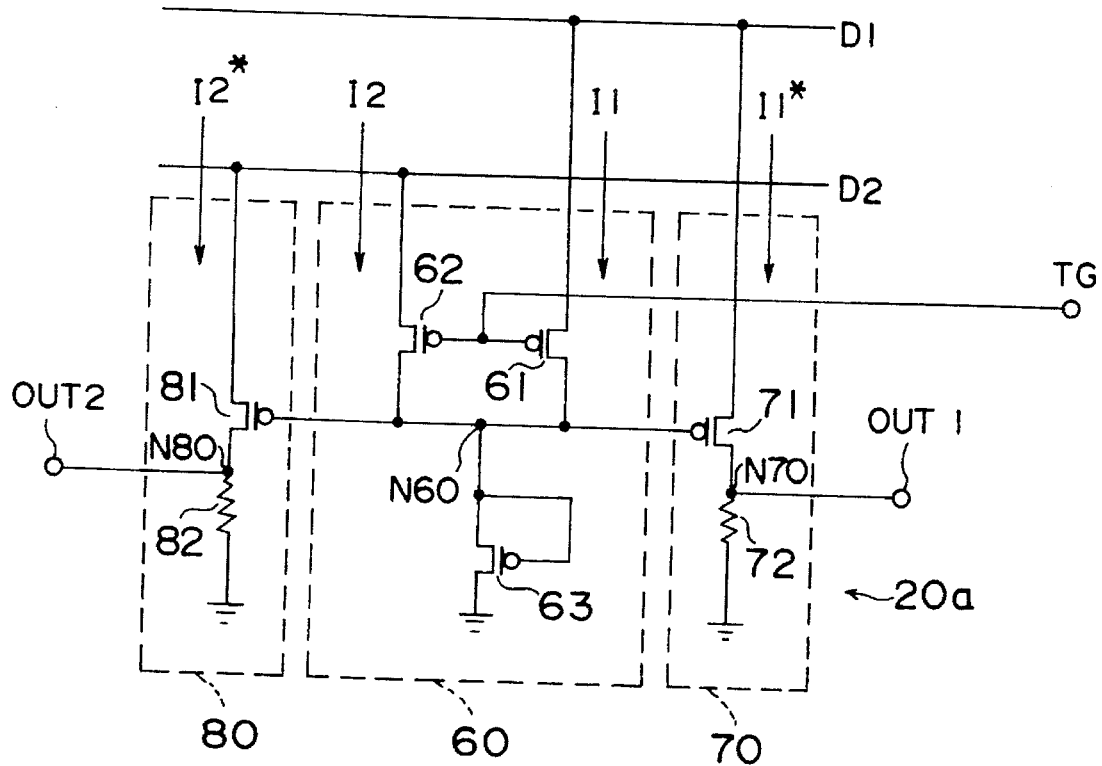
FIGS. 5 to 7 are circuit diagrams showing sense amplifier circuits according to second, third, and fourth preferred embodiments of the present invention, respectively.

Referring to FIG. 5, a sense amplifier circuit of a second preferred embodiment according to the present invention is shown. This sense amplifier circuit 20a is exclusively composed of PMOS transistors in the structure of the sense amplifier circuit shown in FIG. 2. The sense amplifier circuit 20a includes a bias generating circuit 60 coupled to the data lines D1, D2, an amplifier 70 coupled to the data line D1, and an amplifier 80 coupled to the data line D2.

The bias generating circuit 60 includes two PMOS transistors 61, 62 serving as active loads, the sources of which are coupled to the data lines D1, D2, respectively. The PMOS transistors 61, 62 are connected to each other by their drains at a node N60. The gates of the PMOS transistors 61, 62 are commonly supplied with a control signal TG. The node N60 is commonly to the gate and source of a PMOS transistor 63, the drain of which is connected to a ground potential level Vss. The amplifier 70 includes a PMOS transistor 71, the gate of which receives the voltage of the node N60 of the bias generating circuit 60. The source of the PMOS transistor 71 is coupled to the data line D1. The drain of the PMOS transistor 71 is connected to the ground potential level Vss through a load resistor 72. A connection node N70 between the PMOS transistor 71 and the resistor 72 is connected to an output terminal OUT1. The amplifier 80 includes a PMOS transistor 81 the gate of which receives the voltage of the node N60 of the bias generating circuit 60. The source of the PMOS transistor 81 is coupled to the data line D2. The drain of the NMOS transistor 81 is connected to the ground potential level Vss through a load resistor 82. A connection node N80 between the PMOS transistor 81 and the resistor 82 is connected to an output terminal OUT2.

In operation, when very small voltage differences are measured on the data lines D1, D2 at the memory cells of an SRAM on which the sense amplifier circuit 20a is formed, the sense amplifier circuit 20a operates in a manner similar to that of the sense amplifier circuit in FIG. 2. That is, when the PMOS transistors 61, 62 are in the ON state, currents I1, I2 flow from the data lines D1, D2 to the PMOS transistors 61, 62, respectively. The total current (I1+I2) of the currents I1, I2 flows through the PMOS transistor 63, and the node N60 is set at a voltage based on the voltage provided by the total current (I1+I2), providing the bias voltage used for the PMOS transistors 71, 81 in the amplifiers 70, 80. The bias voltage controls the conducting states of the PMOS transistors 71, 81. The two output terminals OUT1, OUT2 of the amplifiers 70, 80 deliver the voltage differences amplified from very small voltage differences of the data lines D1, D2, as in the first embodiment.

If the bias voltage increases due to deviations in manufacturing processes and the actual bias voltage becomes ineffective to the PMOS transistors 71, 81, the output voltage $V_{80}$ at the output terminal OUT2 is given by the following formula:

$$V_{80} = R \cdot (I2^* \times \Delta 2^*)/(Gm+R)$$

wherein R is the resistance of the resistor 82 and Gm is the mutual conductance of the PMOS transistor 82.

When the bias voltage thus changes, the value of the Gm is made smaller, so that deviations of the output voltage $V_{80}$ are suppressed even if the current ($I2^* \times \Delta 2^*$) is made smaller.

As described above, and as in the first embodiment, the sense amplifier circuit can suppress the deviations of the output voltages V70, V80 from the amplifiers 70, 80, and in particular, when used in an SRAM, the sense amplifier circuit 20a can amplify very small voltage differences in a stable manner between the data lines D1, D2. Moreover, since the transistors in the sense amplifier circuit 20a are exclusively PMOS transistors, the sense amplifier circuit 20a can be formed with less pattern area.

Third Embodiment

Figure 6:
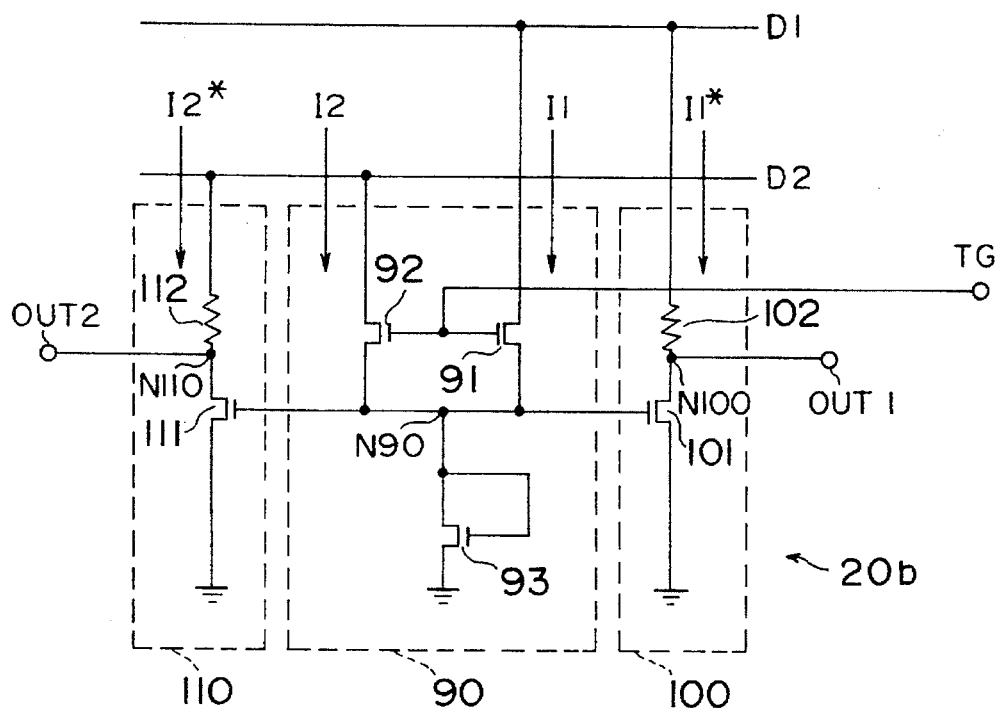

Referring to FIG. 6, a sense amplifier circuit of a third preferred embodiment according to the present invention is shown. This sense amplifier circuit 20b is exclusively composed of NMOS transistors with the structure of the sense amplifier circuit 20a shown in FIG. 5. The sense amplifier circuit 20b includes a bias generating circuit 90 coupled to the data lines D1, D2, an amplifier 100 coupled to the data line D1, and an amplifier 110 coupled to the data line D2.

The bias generating circuit 90 includes two NMOS transistors 91, 92 serving as active load, the drains of which are coupled to the data lines D1, D2, respectively. The NMOS transistors 91, 92 are connected to each other by their sources at a node N90. The gates of the NMOS transistors 91, 92 are commonly supplied with a control signal TG. The node N90 is connected to the gate and drain of an NMOS transistor 93, the source of which is connected to a ground potential level Vss. The amplifier 100 includes an NMOS transistor 101, the gate of which receives the voltage of the node N90 of the bias generating circuit 90. The source of the NMOS transistor 101 is coupled to the ground potential level Vss. The drain of the NMOS transistor 101 is connected to the data line D1 through a load resistor 102. A connection node N100 between the NMOS transistor 101 and the resistor 102 is connected to an output terminal OUT1. The amplifier 110 includes an NMOS transistor 111, the gate of which receives the voltage of the node N90 of the bias generating circuit 90. The source of the NMOS transistor 111 is coupled to the ground potential level Vss. The drain of the NMOS transistor 111 is connected to the data line D2 through a load resistor 112. A connection node N110 between the NMOS transistor 111 and the resistor 112 is connected to an output terminal OUT2.

In operation, the sense amplifier circuit 20b operates in a manner similar to that of the sense amplifier circuits in FIGS. 2 and 5, when very small voltage differences are measured on the data lines D1, D2 at the memory cells of an SRAM on which the sense amplifier circuit 20b is formed. That is, when the NMOS transistors 91, 92 are in the ON state, currents I1, I2 flow from the data lines D1, D2 to the NMOS transistors 91, 92, respectively. The total current (I1+I2) of the currents I1, I2 flows through the NMOS transistor 93, and the node N90 is set at a current based on the total voltage (I1+I2), providing the bias voltage used for the NMOS transistors 101, 111 in the amplifiers 100, 110. The bias voltage controls the conducting states of the NMOS transistors 101, 111. As in the first and second embodiments, the amplifiers 100, 110 deliver at the two output terminals OUT1, OUT2 the voltage differences amplified from very small voltage differences at the data lines D1, D2.

As described above, and as in the first and second embodiments, when used in an SRAM, the sense amplifier circuit 20b can amplify very small voltage differences in a stable manner between the data lines D1, D2. Moreover, since the transistors in the sense amplifier circuit 20b are exclusively made of the NMOS transistors, the sense amplifier circuit 20b can be formed with less pattern area.

Fourth Embodiment

Figure 7:
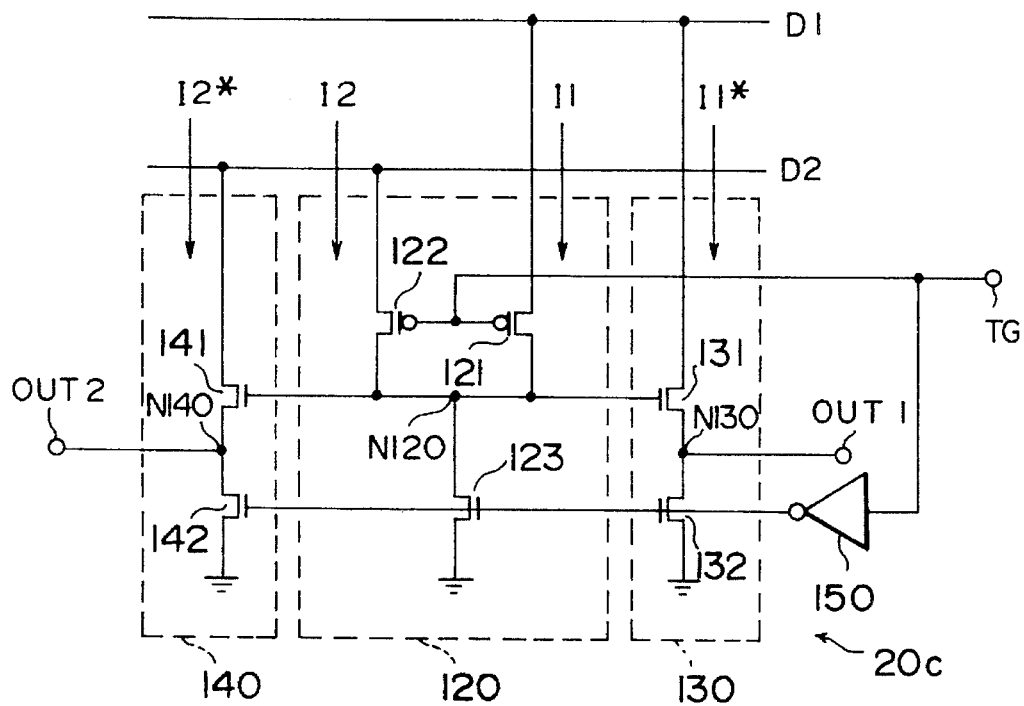

Referring to FIG. 7, a sense amplifier circuit of a fourth preferred embodiment according to the present invention is shown. The sense amplifier circuit 20c includes a bias generating circuit 120 coupled to the data lines D1, D2, an amplifier 130 coupled to the data line D1, and an amplifier 140 coupled to the data line D2.

The bias generating circuit 120 includes two PMOS transistors 121, 122 serving as active loads whose sources are coupled to the data lines D1, D2, respectively. The PMOS transistors 121, 122 are connected to each other at their drains at a node N120. The gates of the PMOS transistors 121, 122 are commonly supplied with a control signal TG. The node N120 is connected to the drain of an NMOS transistor 123, the source of which is connected to a ground potential level Vss. The amplifier 130 includes an NMOS transistor 131, the gate of which receives the voltage of the node N120 of the bias generating circuit 120. The drain of the NMOS transistor 131 is connected to the data line D1. The source of the NMOS transistor 131 is coupled to the drain of an NMOS transistor 132, the source of which is coupled to the ground potential level Vss. A connection node N130 between the NMOS transistor 131 and the NMOS transistor 132 is connected to an output terminal OUT1. The NMOS transistor 132 serves as a load as well as a switch for cutting off through-current. The amplifier 140 includes an NMOS transistor 141, the gate of which receives the voltage of the node N120 of the bias generating circuit 120. The drain of the NMOS transistor 141 is connected to the data line D2. The source of the NMOS transistor 141 is coupled to the drain of an NMOS transistor 142, the source of which is coupled to the ground potential level Vss. A connection node N140 between the NMOS transistor 141 and the NMOS transistor 142 is connected to an output terminal OUT2. The NMOS transistor 142 serves as a load as well as a switch for cutting off through-current. The control signal TG is fed to the gates of the NMOS transistors 123, 132, 142 through an inverter 150.

In operation, when very small voltage differences are measured on the data lines D1, D2 at the memory cells of an SRAM on which the sense amplifier circuit 20c is formed, the PMOS transistors 121, 122 are set to the ON state by turning the level of the control signal TG to the low ("L") logic level. Then, currents I1, I2 flow from the data lines D1, D2 to the PMOS transistors 121, 122, respectively. The total current (I1+I2) of the currents I1, I2 flows through the NMOS transistor 123, and the node N120 is set at a current based on the total voltage (I1+I2), providing the bias voltage used for the NMOS transistors 131, 141 in the amplifiers 130, 140. The bias voltage controls the conducting states of the NMOS transistors 131, 141. As in the first to third embodiments, the amplifiers 130, 140 deliver at the two output terminals OUT1, OUT2 the voltage differences amplified from the very small voltage differences measured at the data lines D1, D2.

After delivering the amplified voltage differences of the data lines D1, D2, when the sense amplifier circuit 20c turns the level of the control signal TG to the high ("H") logic level, the output of the inverter 150 is pulled down to the low level, so that the NMOS transistors 123, 132, 142 and the PMOS transistors 121, 122 are reset to the OFF state.

As described above, the NMOS transistors 123 (as a bias switch), 132, 142 are controlled to be in the ON and OFF states in response to the control signal TG in this embodiment, thereby cutting off the through-currents. The sense amplifier circuit 20c can thus obtain stable output voltage differences, as in the first to third embodiments. Therefore, the sense amplifier circuit 20c can operate with low power consumption.

It is to be noted that the sense amplifier circuit is not limited to the embodiments described above and can be modified in various ways. For example: although formed in the SRAM in the embodiments above, the sense amplifier circuit according to the invention can be formed in a DRAM (dynamic RAM) and will operate so as to provide stable outputs even if the level of the data lines vary due to manufacturing deviations; although the NMOS transistors 123, 142 for cutting off the through-current also serve as loads in the fourth embodiment, the sense amplifier circuit according to the invention can be associated with a load resistor specifically and separately provided; although in the first to fourth embodiments the bias generating circuits 21, 60, 90, 120 and the amplifiers 22a, 22b, 70, 80, 100, 110, 130, 140 are connected uniformly to the ground potential level Vss, a level to which the bias generating circuit is connected can be different from a level to which the amplifiers are connected.

As described above, the sense amplifier circuit according to the invention includes a bias generating circuit for setting a bias voltage corresponding to shifts of currents flowing from the data lines, and an amplifying circuit coupled between the data line and a second potential, having a transistor, the conducting state of which is controlled based on the bias voltage, for providing a voltage corresponding to the voltage of the data line, so that even if the data lines' voltages are shifted, the sense amplifier circuit can deliver stable outputs. Therefore, this invention allows the sense amplifier circuit to provide its output in a stable manner even if formed in a memory with shifted reading out levels which could have been subject to deviations due to adverse influence from manufacturing processes.

The sense amplifier circuit can be formed with transistors controlled by the control signal and arranged in the bias generating circuit and the amplifier circuit for cutting off the connections to the first or second potential. Therefore, when the sense amplifier circuit does not have to operate, the control signal can cut off the bias generating circuit and amplifying circuit from the first and second potentials. Accordingly, the sense amplifier circuit can operate with low power consumption.

It is understood that although the present invention has been described in detail with respect to preferred embodiments thereof, various other embodiments and variations are possible, as recognized by those skilled in the art, which fall within the scope and spirit of the invention, and such other embodiments and variations are intended to be covered by the following claims.

What is claimed is:

1. A sense amplifier circuit, comprising:
  a first data line having a first voltage corresponding to data transferred on the first data line;
  a second data line having a second voltage corresponding to data transferred on the second data line;
  a bias generating circuit, coupled to the first and second data lines and a first potential and including a first resistance, for generating a bias voltage corresponding to the first and second voltages and the first resistance;
  a first amplifier, coupled to the first data line, the bias generating circuit and a second potential and including a second resistance, for generating a first output voltage corresponding to the first voltage, the bias voltage, and the second resistance; and
  a second amplifier, coupled to the second data line, the bias generating circuit and the second potential and including a third resistance, for generating a second output voltage corresponding to the second voltage, the bias voltage, and the third resistance.

2. The sense amplifier circuit as set forth in claim 1, wherein the bias generating circuit includes a bias switch for disconnecting the bias generating circuit from the first potential, according to a control signal, and wherein the first and second amplifiers include respective first and second switches for disconnecting the first and second amplifiers from the second potential, according to the control signal.

3. The sense amplifier circuit as set forth in claim 2, wherein the first switch includes a first load and the second switch includes a second load, and wherein the first load includes a first MOS transistor and the second load includes a second MOS transistor.

4. The sense amplifier circuit as set forth in claim 3, wherein the first data line carries a first current and the second data line carries a second current, and wherein the first and second MOS transistors are controlled by the control signal to allow a component of the first current to flow through the first amplifier and a component of the second current to flow through the second amplifier.

5. The sense amplifier circuit as set forth in claim 1, wherein the first and second data lines have complimentary logic states.

6. The sense amplifier circuit as set forth in claim 5, wherein:
- the first amplifier includes a first NMOS transistor, the first NMOS transistor including
  - a gate for receiving the bias voltage,
  - a source coupled to the second potential, and
  - a drain coupled to a first end of the first load,
- wherein the first load has a second end coupled to the first data line, and
- wherein the sense amplifier circuit includes a first output connected between the first NMOS transistor and the first load; and
- the second amplifier includes a second NMOS transistor, the second NMOS transistor including
  - a gate for receiving the bias voltage,
  - a source coupled to the second potential, and
  - a drain coupled to a first end of the second load,
- wherein the second load has a second end coupled to the second data line, and
- wherein the sense amplifier circuit includes a second output connected between the second NMOS transistor and the second load.

7. The sense amplifier circuit as set forth in claim 5, wherein: the first amplifier includes a first PMOS transistor, the first PMOS transistor including
- a gate for receiving the bias voltage,
- a source coupled to the first data line, and
- a drain coupled to a first end of the first load,
- wherein the first load has a second end coupled to the second potential, and
- wherein the sense amplifier circuit includes a first output connected between the first PMOS transistor and the first load; and
- the second amplifier includes a second PMOS transistor, the second PMOS transistor including
  - a gate for receiving the bias voltage,
  - a source coupled to the second data line, and
  - a drain coupled to a first end of the second load,
- wherein the second load has a second end coupled to the second potential, and
- wherein the sense amplifier circuit includes a second output connected between the second PMOS transistor and the second load.

8. The sense amplifier circuit as set forth in claim 1, wherein the first amplifier includes a first PMOS transistor and the second amplifier includes a second PMOS transistor.

9. The sense amplifier circuit as set forth in claim 1, wherein the first amplifier includes a first NMOS transistor and the second amplifier includes a second NMOS transistor.

10. The sense amplifier circuit as set forth in claim 1, wherein the first and second data lines are coupled to a plurality of bit line pairs for transmitting data from and to a plurality of memory cells.

11. The sense amplifier circuit as set forth in claim 10, wherein the first and second data lines are included in an SRAM circuit and are precharged to a power supply voltage level, and wherein the first and second potentials are ground level potential.

12. The sense amplifier circuit as set forth in claim 10, wherein the bit line pairs are included in an SRAM circuit and are precharged to a power supply voltage level, and wherein the first and second potentials are ground level potential.

13. A sense amplifier circuit, comprising:
- a first data line having a first voltage corresponding to data transferred thereon;
- a second data line having a second voltage corresponding to data transferred thereon;
- a bias generating circuit including
  - a first transistor including a first electrode coupled to said first data line, a second electrode, and a gate electrode,
  - a second transistor including a first electrode coupled to said second data line, a second electrode, and a gate electrode coupled to the gate electrode of the first transistor, and
  - a third transistor including a first electrode coupled to the second electrodes of the first and second transistors, a second electrode coupled to a first potential, and a gate electrode;
- a first amplifier for generating a first output voltage having a fourth transistor and a first resistance connected in series to form a first series circuit, the fourth transistor including a gate electrode coupled to said bias generating circuit, wherein a first end of the first series circuit is connected to the first data line and a second end of the first series circuit is connected to a second potential; and
- a second amplifier for generating a second output voltage having a fifth transistor and a second resistance connected in series to form a second series circuit, the fifth transistor including a gate electrode coupled to the bias generating circuit, wherein a first end of the second series circuit is connected to the second data line an a second end of the second series circuit is connected to the second potential.

* * * * *